United States Patent
Kim

(10) Patent No.: US 12,367,132 B2
(45) Date of Patent: Jul. 22, 2025

(54) READ CONTROL SIGNAL GENERATION FOR MEMORY

(71) Applicant: Micron Technology, Inc., Boise, ID (US)

(72) Inventor: Jaeil Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/234,636

(22) Filed: Aug. 16, 2023

(65) Prior Publication Data

US 2024/0070058 A1 Feb. 29, 2024

Related U.S. Application Data

(60) Provisional application No. 63/373,924, filed on Aug. 30, 2022.

(51) Int. Cl.
*G06F 12/02* (2006.01)
*G11C 11/22* (2006.01)
*G11C 11/4096* (2006.01)
*G11C 11/4076* (2006.01)

(52) U.S. Cl.
CPC ........ *G06F 12/023* (2013.01); *G11C 11/2273* (2013.01); *G11C 11/4096* (2013.01); *G11C 11/2293* (2013.01); *G11C 11/4076* (2013.01)

(58) Field of Classification Search
CPC ............ G11C 11/2273; G11C 11/4096; G11C 11/2293; G11C 11/4076
See application file for complete search history.

(56) References Cited

U.S. PATENT DOCUMENTS

| | | | |
|---|---|---|---|
| 11,513,725 B2* | 11/2022 | Park | G06F 3/0604 |
| 2019/0130949 A1* | 5/2019 | Kim | G11C 7/1069 |
| 2024/0211420 A1* | 6/2024 | Woo | G06F 13/1689 |

* cited by examiner

*Primary Examiner* — Edward J Dudek, Jr.

(74) *Attorney, Agent, or Firm* — Schwegman Lundberg & Woessner, P.A.

(57) ABSTRACT

A system includes memory having a bank area and a channel area. The system further includes control circuitry to receive a command to access the memory. Responsive to receiving the command to access the memory, the control circuitry can provide a bank strobe signal for accessing memory in the bank area and at least two channel strobe signals for accessing memory in the channel area. The channel strobe signal may process a smaller amount of data than that processed by the bank strobe signal.

17 Claims, 7 Drawing Sheets

READ CONTROL SIGNAL GENERATION FOR MEMORY

PRIORITY APPLICATION

This application claims the benefit of priority to U.S. Provisional Application Ser. No. 63/373,924, filed Aug. 30, 2022, which is incorporated herein by reference in its entirety.

TECHNICAL FIELD

Embodiments pertain to memory devices. Some embodiments pertain to strobe signals for memory access operations.

BACKGROUND

Memory devices for computers or other electronic devices may be categorized as volatile and non-volatile memory. Volatile memory requires power to maintain its data, and includes random-access memory (RAM), dynamic random-access memory (DRAM), Holographic RAM (HRAM), or synchronous dynamic random-access memory (SDRAM), among others. Non-volatile memory can retain stored data when not powered, and includes, without limitation, ferroelectric random access memory (FeRAM) devices, flash memory, read-only memory (ROM), electrically erasable programmable ROM (EEPROM), static RAM (SRAM), erasable programmable ROM (EPROM), resistance variable memory, phase-change memory, three-dimensional cross-point memory, storage class memory, resistive random-access memory (RRAM), and magnetoresistive random-access memory (MRAM), among others. Persistent memory is an architectural property of the system where the data stored in the media is available after system reset or power-cycling. In some examples, non-volatile memory media may be used to build a system with a persistent memory model.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

In some types of memory, strobe signals in different areas of the memory device can process varying numbers of bytes of data on read operations. There is a general need to coordinate the amount of data read for consistent memory device output.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
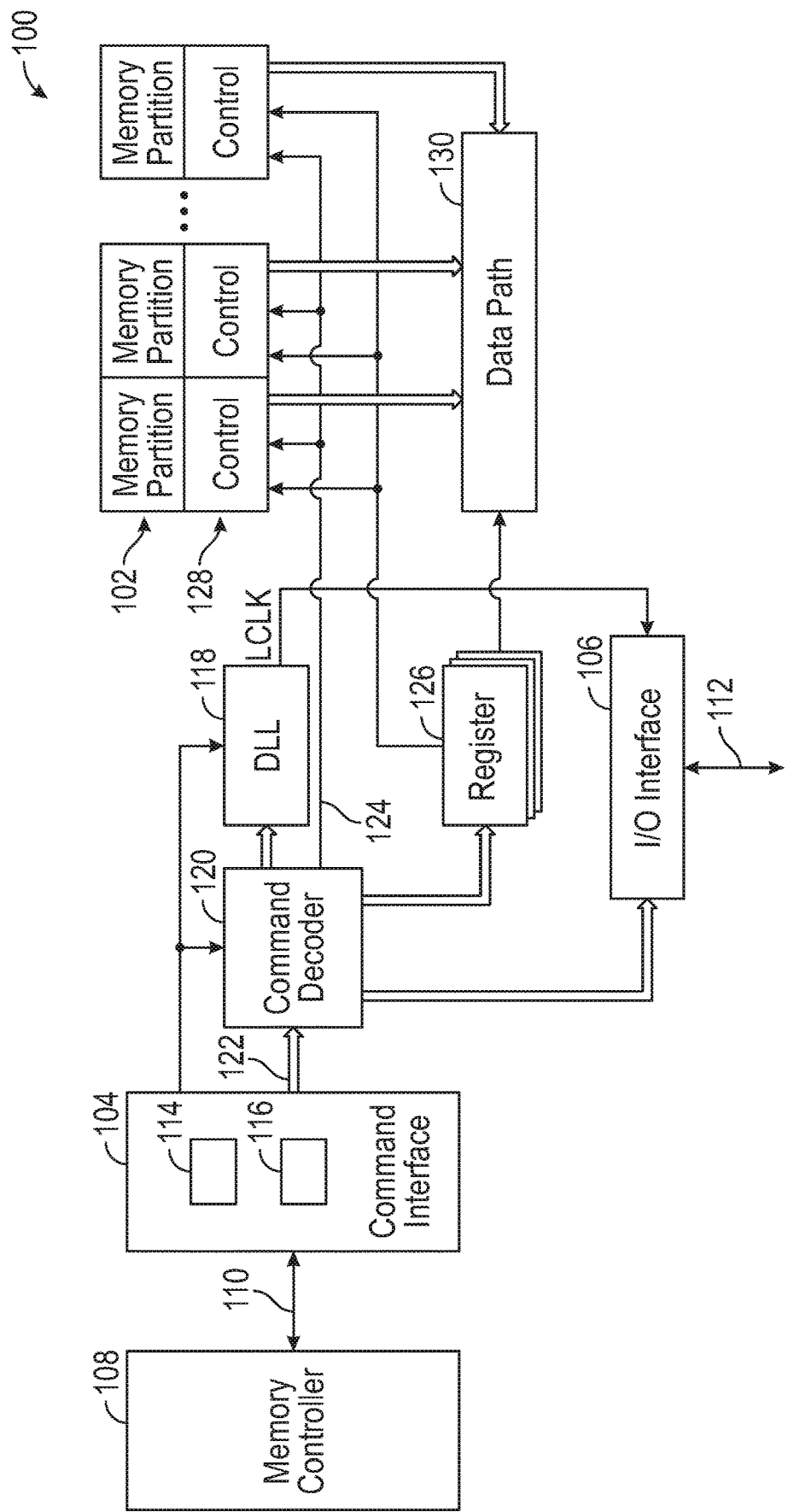
FIG. 1 illustrates generally an example block diagram of a memory device.

FIG. 1 illustrates generally a simplified block diagram of various features of a memory device 100. The block diagram of FIG. 1 can be a functional block diagram illustrating various functions of the memory device 100. In accordance with one embodiment, the memory device 100 may be a random access memory (RAM) device, a dynamic RAM (DRAM) device, a static RAM (SRAM) device (including a double data rate SRAM device), a ferroelectric RAM (FeRAM), holographic RAM (HRAM) flash memory, and/or a phase change memory (PCM) device and/or other chalcogenide-based memory, such as self-selecting memories (SSM). Moreover, the memory cells of the memory device can each have a corresponding logic storing device (e.g., a capacitor, a resistor, or a chalcogenide device).

In some examples, the memory device 100 comprises a ferroelectric RAM (FeRAM), which can utilize two separate operations in the performance of reading or writing functions. These two separate operations can include sensing and programming operations that comprise setting different access lines (e.g., digit lines, plate lines, word lines) to relatively high or low levels, as described with reference to FIG. 1.

In an example, the memory device 100 comprises a cell, or array of cells, arranged according to a planar architecture, with discrete cells or memory elements located at crossings of Word Lines (WL) and Bit Lines (BL). In some examples, memory cells can be programmable to store different logic states. In some cases, a memory cell may be programmable to store two logic states, denoted as a logic 0 and a logic 1. In some cases, a memory cell may be programmable to store more than two logic states.

In some examples, memory cells may store an electrical charge representative of the programmable logic states in a capacitive memory element. For example, a charged and uncharged capacitor of a memory cell may represent two logic states, respectively, or a positively charged and a negatively charged capacitor of a memory cell may represent two logic states, respectively. In some examples, such as FeRAM architectures, a memory cell may include a ferroelectric capacitor having a ferroelectric material as an insulating layer between terminals of the capacitor. Different levels of polarization of a ferroelectric capacitor may represent different logic states (e.g., supporting two or more logic states in a respective memory cell). Ferroelectric materials have non-linear polarization properties The memory device 100 can include memory partitions 102, and each memory partition 102 can include one or more cell arrays (i.e., memory arrays). Various configurations, organizations, and sizes of a memory partition 102 on the memory device 100 can be used depending on the application and design of the overall system. For example, each of the memory partitions 102 can comprise a respective different die in a stacked memory device. In such a device, at least one die can be a primary die that interfaces with a host, or a memory controller 108, using an inter-device bus 110, and one or more other dies can be secondary dies that interface with the primary die using an intra-package bus 124. Arrays can also be sub-divided into multiple separately-addressable portions (e.g., into multiple channels, banks, ranks, etc.). Alternatively, a memory system can include multiple memory devices such as the memory device 100 of FIG. 1, where each memory device represents a separately-addressable sub-division (e.g., rank, etc.) of the memory capacity of the system. Accordingly, a memory device or a memory system with multiple memory devices, ranks, channels, banks or the like can include multiple terminals (e.g., clock terminals, CMD/ADD terminals, I/O terminals, etc.) that are dedicated to one or more, but less than all of, the separately-addressable portions. For example, a multi-channel memory device can include multiple terminals, each corresponding to one of the multiple channels of memory.

The memory device 100 can include a command interface 104 and an input/output interface 106. The command interface 104 can receive various signals from an external host device, such as a processor or controller (e.g., a memory controller 108) external to the memory device 100. In some embodiments, an inter-device bus 110 (or a signal path or a group of signal paths) can, individually or in combination, allow for bidirectional transmission of signals between the command interface 104 and the processor or controller (e.g., the memory controller 108).

In an example, the memory device 100 can include a second bus 112 (or a signal path or another group of signal paths) that can, individually or in combination, allow for bidirectional transmission of signals, including, for example, data signals, between the input/output interface 106 and, for example, the processor or controller (e.g., the memory controller 108). Thus, the processor or controller, for example, the memory controller 108, can provide various signals to the memory device 100 to facilitate transmission and receipt of data to be written to or read from the memory device 100.

In an example, the command interface 104 can include or use a number of circuits, such as a clock input circuit 114 and a command/address input circuit 116, to ensure proper handling of the received signals. The command interface 104 can receive one or more clock signals from an external device, such as the memory controller 108. The command interface 104 can receive commands (e.g., read command, write command, etc.), that can be entered on, e.g., positive edges of the clock signal, and can receive data, such as can be transmitted or received on positive and/or negative edges of the clock signal. In some examples, the commands can have a variable clock length (e.g., one or more clocks can be used to receive the commands).

The clock input circuit 114 can receive the one or more clock signals and generate an internal clock signal CLK therefrom. In some embodiments, the internal clock signal CLK is supplied to an internal clock generator 118, such as a delay locked loop (DLL) circuit. The internal clock generator 118 generates a phase-controlled internal clock signal LCLK based on the received internal clock signal CLK. The phase controlled internal clock signal LCLK can be provided to the input/output interface 106, for instance, and can be used as a timing signal for determining an output timing of read data.

The internal clock signal CLK can be provided to various other components within the memory device 100 and can be used to generate various additional internal clock signals. For instance, the internal clock signal CLK can be provided to a command decoder 120. The command decoder 120 can receive command signals from the command bus 122 and can decode the command signals to provide various internal commands. For example, the command decoder 120 can provide command signals to the internal clock generator 118 using an internal bus to coordinate generation of the phase-controlled, internal clock signal LCLK. In some examples, the phase-controlled, internal clock signal LCLK can be used to clock data through the input/output interface 106. In an example, a frequency of the internal clock signal CLK can be less than a frequency of a clock signal used by the memory controller 108 to communicate via the inter-device bus 110.

In an example, the command decoder 120 can decode commands, such as read commands, write commands, register set commands, activate commands, etc., and provide access to a particular one of the memory partitions 102 corresponding to the command, such as via an intra-package bus 124. The command decoder 120 can transmit various signals to one or more registers 126 via a bus path (e.g., one or more global wiring lines). In an example, the memory device 100 can include various other decoders, such as row decoders and column decoders, to facilitate access to the various memory partitions 102. In one embodiment, each memory partition 102 can include a respective control block 128 that provides decoding (e.g., row and/or column decoding), as well as other features, such as timing control and data control, to facilitate the execution of commands to and from the respective memory partition 102.

In an example, the command decoder 120 or other component in the memory device 100 can provide register commands to the one or more of the registers 126, which can be used in operations of each of the memory partitions 102, each control block 128, and the like. For example, one of the registers 126 can define various modes of programmable operations and/or configurations of the memory device 100. The registers 126 can be included in semiconductor devices to define operations for various types of memory components, such as DRAM, synchronous DRAM, FeRAM or other types of memories. The registers 126 can receive various signals from the command decoder 120 via wiring lines that can include a common data path, a common address path, a common write command signal path, or a common read command signal path. The wiring lines can traverse the memory device 100 and couple to each register 126.

The registers 126 can be accessed or otherwise accessible by the memory controller 108. The registers 126 can be dispersed across the memory device 100 and the registers can represent or contain information such as configuration settings of the memory device 100 and/or specific components therein, status information about the memory device 100 and/or specific components therein, memory device 100 parameters and/or specific parameters for components of the memory device 100, or predetermined patterns that can be written across the memory device (e.g., in one or more of the memory partitions 102). Thus, while the registers 126 are illustrated in FIG. 1, it should be appreciated that additional and/or alternative registers can be located elsewhere in the memory device and can be accessed by the memory controller 108 (i.e., when in operation, the registers are accessed by the memory controller 108). Such accesses by the memory controller 108 can include, for example, reads of the registers (e.g., read accesses) and/or writes to the registers (e.g., write accesses).

In an example, the memory device 100 executes operations, such as read commands and write commands, based on the command/address signals received from an external device, such as a processor and/or by the memory controller 108. In one example, command/address signals are clocked to the command interface 104 using clock signals. The command interface 104 can include a command/address input circuit 116 that is configured to receive and transmit the commands to provide access to the memory partitions 102, through the command decoder 120. The command interface 104 can receive memory select signals that enable the memory device 100 to process commands on the incoming command/address signals. Access to specific memory partitions 102 within the memory device 100 can be encoded in the commands.

The command interface 104 can be configured to receive various other command signals. For example, a reset command can be used to reset the command interface 104, status registers, state machines and the like, during power-up or standby exit, for instance. Various signals to facilitate testing of the memory device 100 may be provided. For instance, test signals can be used to place the memory device 100 into a test mode for connectivity testing. The command interface 104 can be used to provide an alert signal or other alarm signal to the system processor or controller for certain errors that may be detected. In some embodiments, the input/output interface 106 can additionally or alternatively transmit an alert signal, for example, a thermal alert.

Data can be sent to and from the memory device 100 using the command and clocking signals discussed above, for example, by transmitting and receiving data signals through the input/output interface 106. More specifically, the data can be sent to or retrieved from the memory partitions 102 over a data path 130, such as can include multiple bidirectional data buses. Data I/O signals, for example, can be transmitted and received in one or more bidirectional data busses to and from the input/output interface 106. For particular memory devices, such as a DDR5 SDRAM memory device, the I/O signals can be divided into upper and lower bytes; however, such segmentation is generally not used for other memory device types.

As will be appreciated, various other components such as power supply circuits (for receiving external VDD and VSS signals), read/write amplifiers (to amplify signals during read/write operations), temperature sensors (for sensing temperatures of the memory device 100), etc., can be incorporated with the memory device 100. Accordingly, it should be understood that the block diagram of FIG. 1 is only provided to highlight certain functional features of the memory device 100 to aid in the subsequent detailed description.

As mentioned earlier herein, the memory device 100 can include memory banks and channels. In some memory types and configurations (for example in compute express link (CXL) configurations, e.g., IOX8 & BL32 configurations), bank area strobe signals can each process a number of data units (e.g., 256 bytes, although embodiments are not limited thereto) whereas, in contrast, fewer data units are processed in the channel area for each strobe signal. To address these and other concerns, embodiments herein can disable the second strobe signal.

Figure 2:
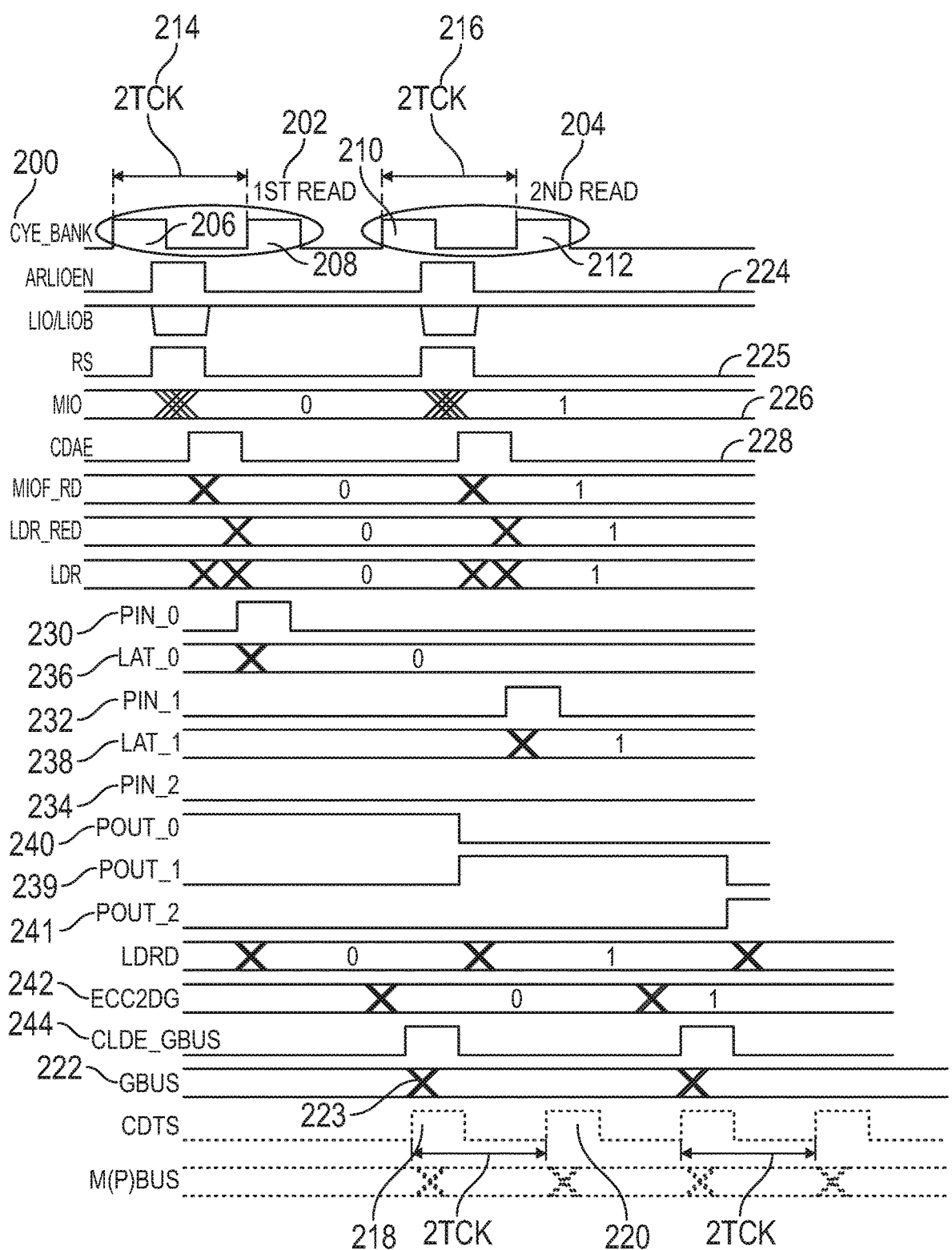
FIG. 2 illustrates strobe signals and other signals used in accessing memory in accordance with some embodiments.

FIG. 2 illustrates strobe signals and other signals used in accessing memory in accordance with some embodiments. Signal 200 illustrates that for each read 202, 204, two bank area strobe signals 206, 208, 210, 212 are generated, with a duration 214, 216 between each pair of signals 206, 208 and 210, 212. In the example shown in FIG. 2, for each read 202, 204, two column data timing strobe (CDTS) signals 218, 220 are given to the channel area because, as mentioned earlier herein, to output 256 data to 8 DQs, two CDTS signals are needed in units of 128 data. However, the example provided in FIG. 2 is not meant to limit example embodiments; instead, other numbers of strobe signals, and bytes processed by each strobe signal, can be implemented in other example embodiments. The output is shown at on the read/write bus (GBUS) 222 and is strobed by the two CDTS signals 218, 220. The GBUS 222 provides 256 bytes of data at each processing 223.

The second CYE signal of each pair (e.g., pulse 208 and 212) should be disabled. Signal 224 is a column selection signal and signal 225 is a row selection signal. According to the column address, the column select signal 224 is enabled and data is output from the bank area to the main IO data line 226. Signal 228 strobes the main IO data line 226.

Signals 230, 232, and 234 are pipe input operations and signals 236, 238 are pipe latch operations, with pipe outputs 239, 240 and 241 for outputting the data to the channel area at signal 242 on the GBUS 222. Signals 230, 232 and 234 are enabled with MIO signal 226. Signal 244 is a bank area driving signal that is enabled one time by signal 206. To synchronize timing, the CDTS signal is given to the channel area to process the data in the channel area at a time 2tck that is similar to the time period 214 provided in the bank area.

Figure 3A:
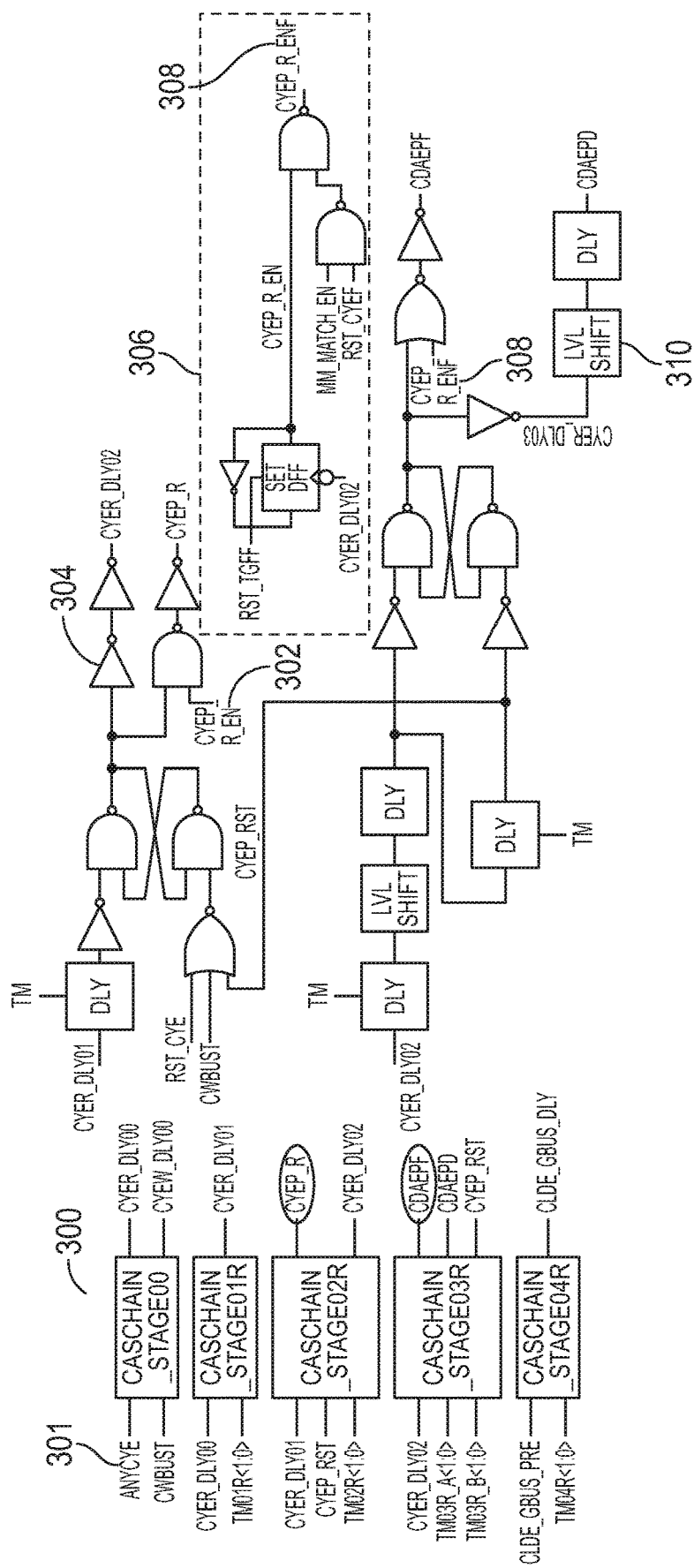
FIG. 3A and FIG. 3B provide a schematic diagram illustrating disable circuitry according to some embodiments.
Figure 3B:
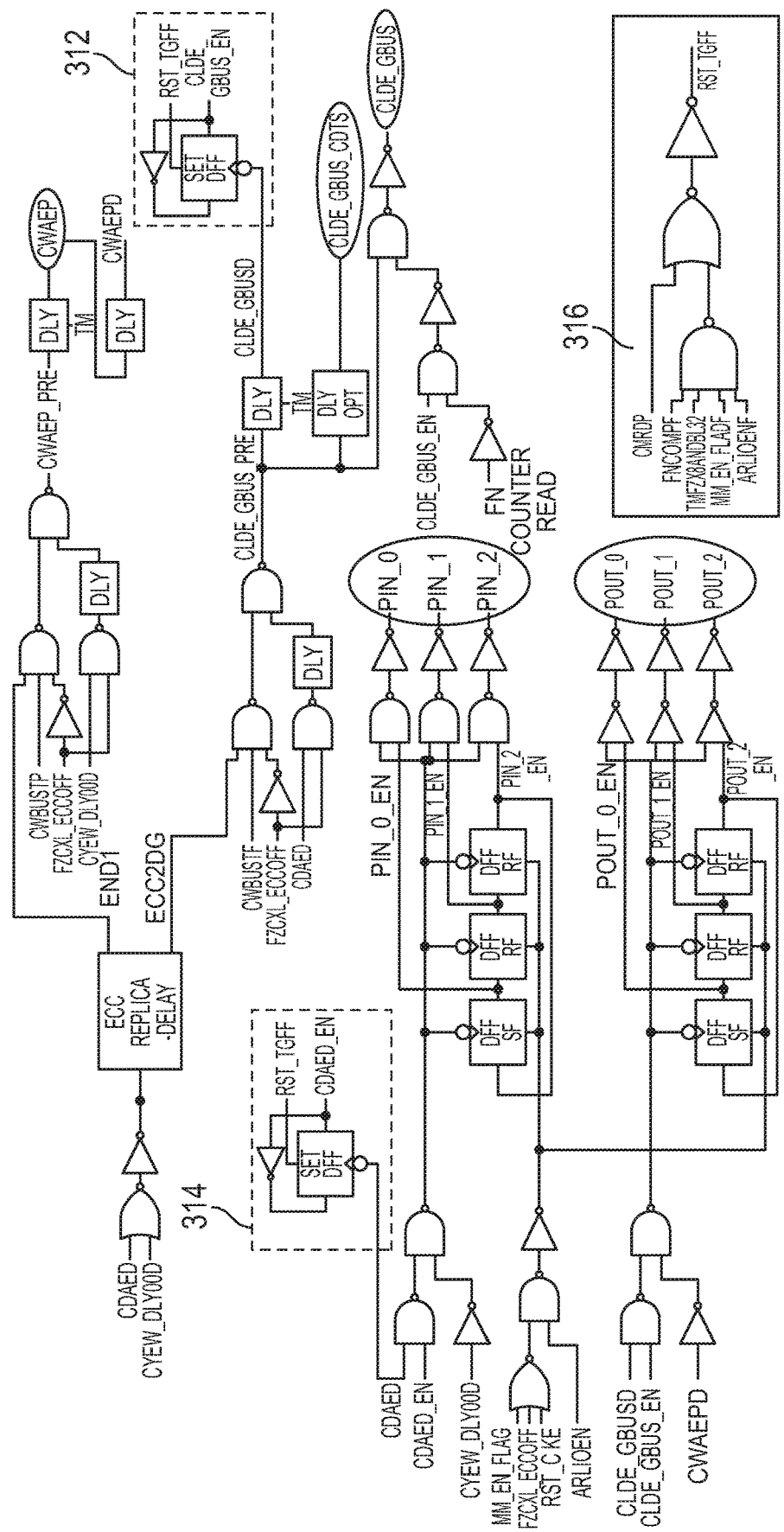

FIG. 3A and FIG. 3B provide a schematic diagram illustrating disable circuitry according to some embodiments. A bank control path 302 and channel control path 304 are also shown. As shown in FIG. 3A, blocks 300 provide delay blocks for providing the control signals shown in FIG. 2. Input 301 to blocks 300 are provided by the signal 200 (FIG. 2). Path 302 includes an enabling signal for enabling and disabling the bank strobe signal as described earlier herein. On the other hand, the channel strobe signal is kept enabled in path 304, meaning that the channel strobe signal is always provided and not disabled in example embodiments. Sub-circuit 306 also provides output 308 that is used to generate a signal for disabling every other bank strobe signal. Path 310 also helps keep the channel strobe signal enabled (as opposed to the bank strobe signal that is disabled at every other pulse or some subset thereof).

As shown in FIG. 3B, sub-circuit 312 provides circuitry to generate signal 244 (FIG. 2) for providing second channel strobe signals (e.g., additional pulse 220) for processing additional bytes of data in the channel area. Sub-circuit 314 provides circuitry to disable pipe signal 234. Sub-circuit 316 provides internal read, mask write, and memory management operations that can remain enabled even when other strobe signals are disabled as described earlier herein. These and other commands are only generated in the bank area and accordingly disabling of bank strobe signals is not provided.

Figure 4:
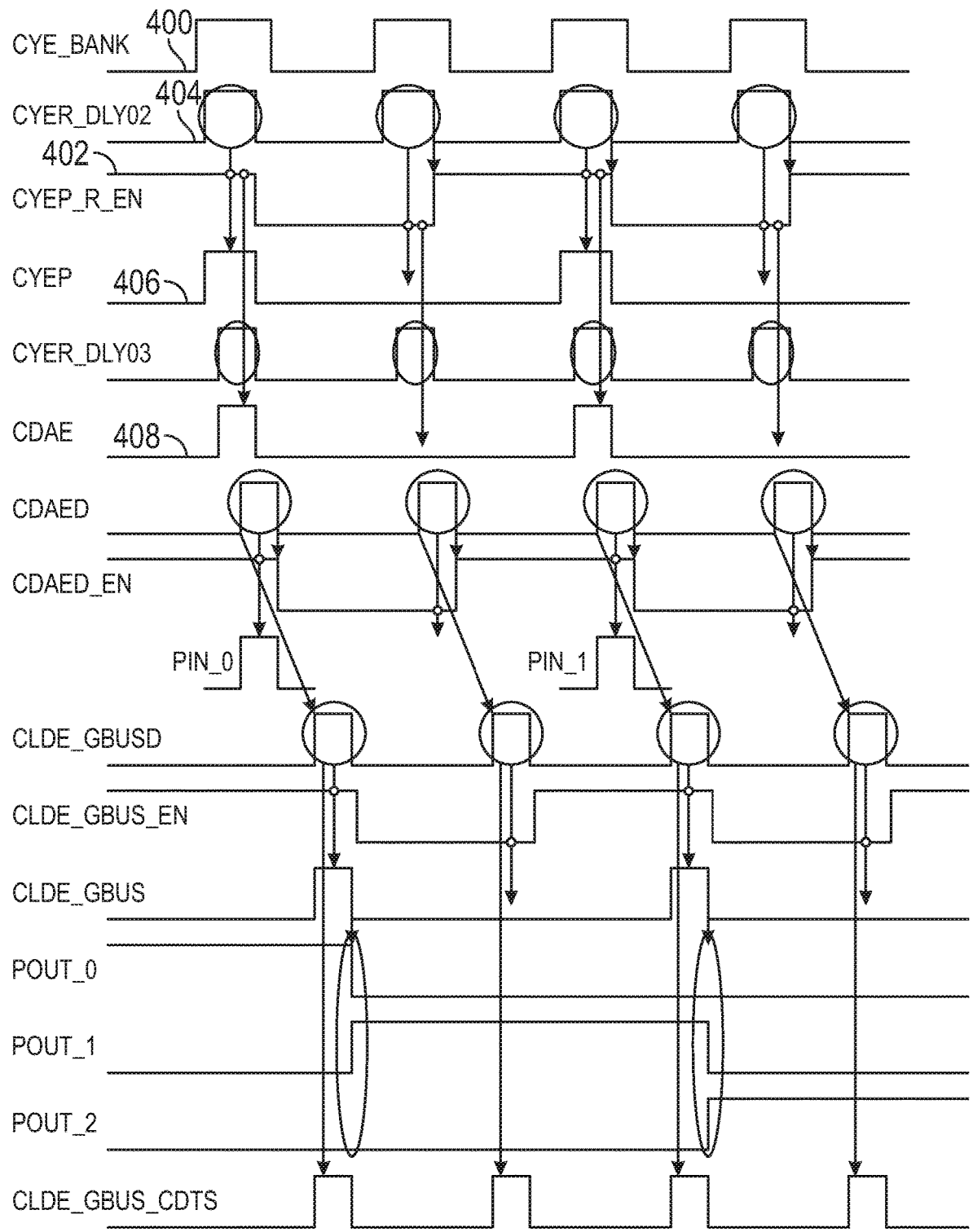
FIG. 4 illustrates signals for generating delays and disabling signals as described earlier herein according to various embodiments.

FIG. 4 illustrates signals for generating delays and disabling signals as described earlier herein according to various embodiments. Signal 400 is a bank strobe signal. Signal 402 toggles on a falling edge of signal 404. Based on this toggling, a bank strobe signal can be disabled as shown at signal 406 (where the second bank strobe signal pulse is not present, as shown in the gap in time between pulses at signal 406). Furthermore, on a next rising edge of signal 402, while signal 404 is high, the signal 406 again goes high, enabling the bank strobe signal. Likewise, signal 408 includes a gap where a second bank strobe signal pulse would have been but is again enabled when signal 402 is on a rising edge and signal 404 is high.

Referring again to FIG. 3A, it can be seen that signal 308 is similar to signal 402 (FIG. 4); in other words, signal 402 is used to disable certain of the bank strobe signals using the circuitry seen in FIG. 3A. Furthermore, comparing FIG. 4 to FIG. 3A, signal 402 is provided to the flipflop circuitry within circuit 306 and signal 404 is an output of that flipflop and provided for enabling and disabling signal 308.

Referring again to FIG. 4, in the bank area, a CS signal is generated with signal 406, which selects a column address, and data is driven to the MIO. After driving data to the MIO, a CDAE signal 408 strobes the data to the MIO. Signal 409 provides a delay for removal of error code correction (ECC) artifacts. After data is strobed to the MIO, pipe control signals are generated, for example pipe inputs 410 and pipe outputs 412, 414 and 416 are generated. After pipe signals are provided, then signal 418 is provided such that when signal 418 is enabled, the pipe latch data is driven to the GBUS which is connected to the channel area. Signal 406 and the pipe signals are enabled one time and then channel strobe signals 420 are enabled twice to provide, e.g., 128 bytes of data or other amount of data two times per each bank area strobe as described earlier herein.

Figure 5:
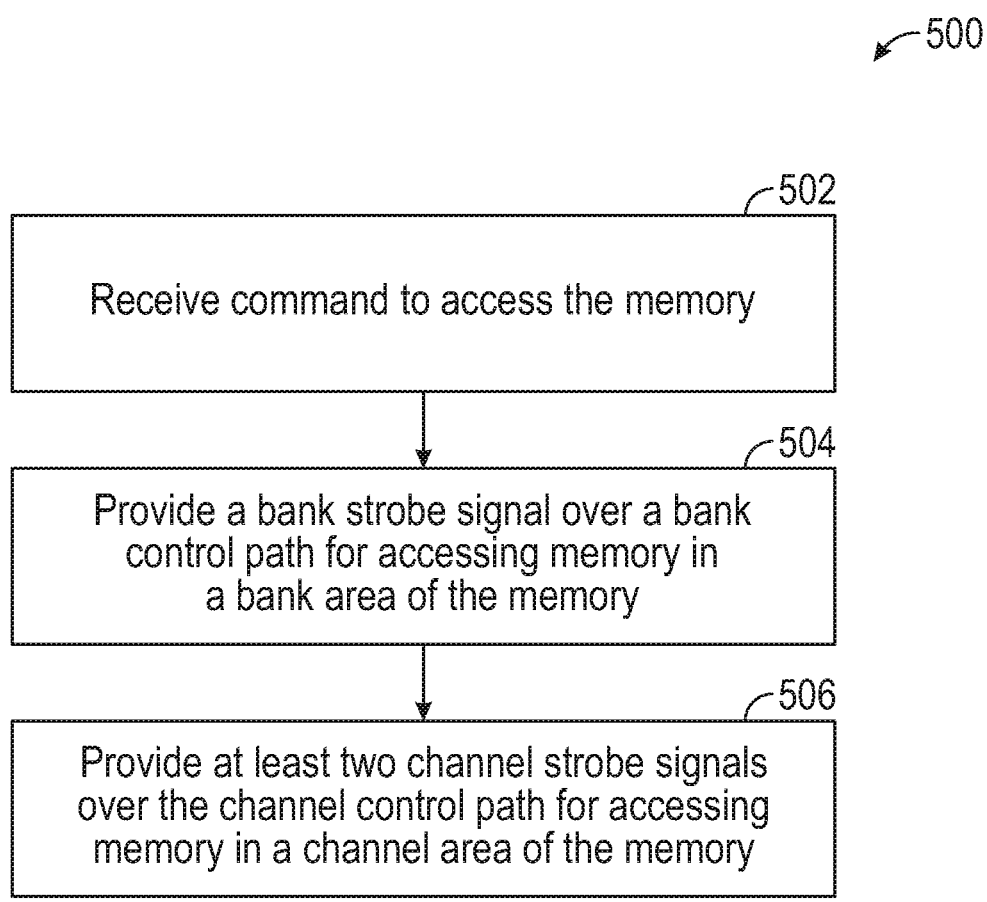
FIG. 5 illustrates a method for accessing memory according to various embodiments.

FIG. 5 illustrates a method 500 for accessing memory according to various embodiments. The method 500 can begin with operation 502 with receiving a command to access the memory.

The method 500 can continue with operation 504 with, responsive to receiving the command to access the memory, providing a bank strobe signal (e.g., signal 299 (FIG. 2) or signal 400 (FIG. 4)) over a bank control path 302 for accessing memory in a bank area of the memory. The method 500 can continue with operation 506 with providing at least two channel strobe signals (e.g., signal CDTS or 218, FIG. 2) over the channel control path 304 for accessing memory in a channel area of the memory. In some embodiments, a channel strobe signal processes one half the amount of data of the bank strobe signal, although embodiments are not limited to any particular proportion or number.

Figure 6:
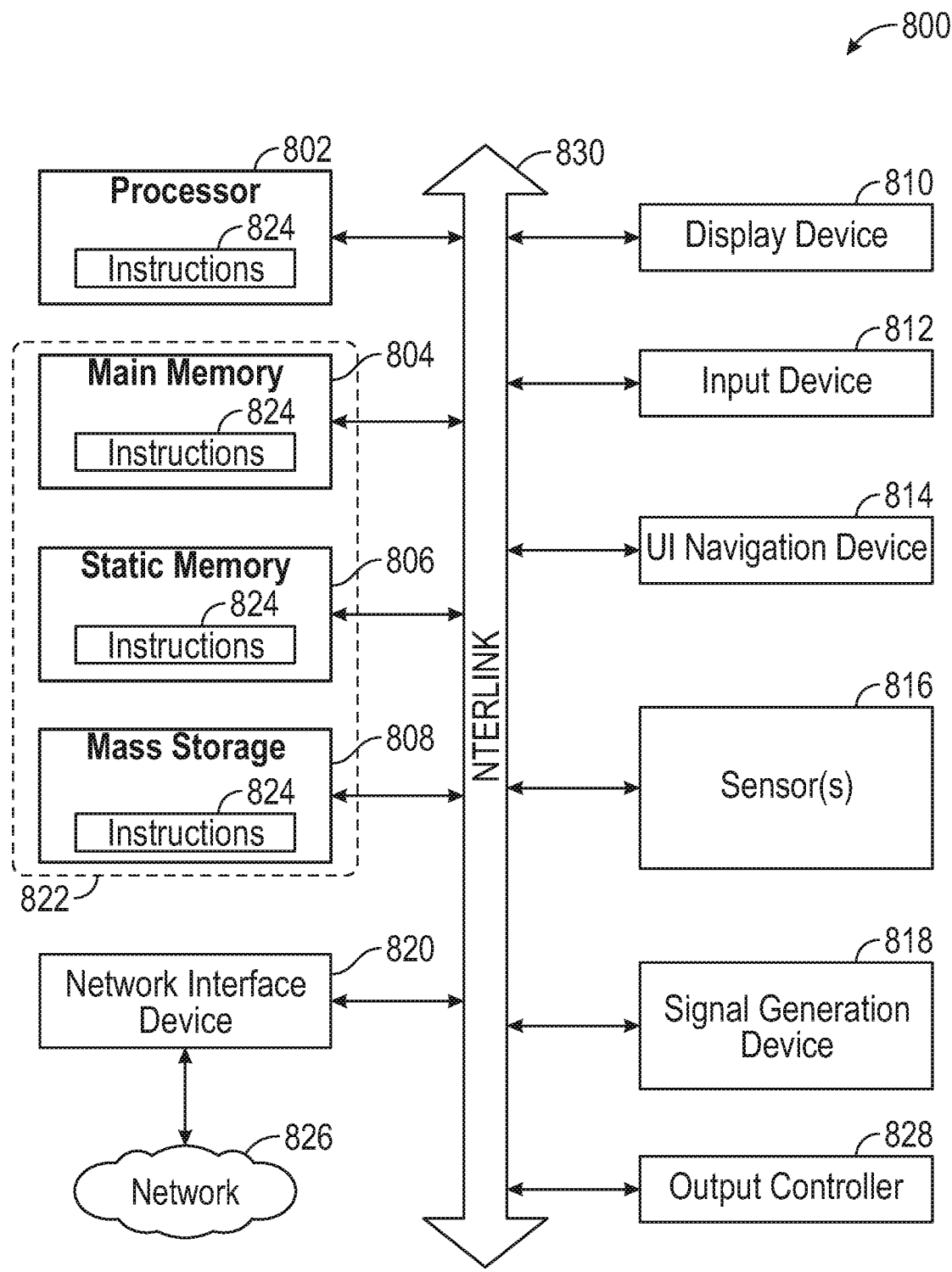
FIG. 6 illustrates a block diagram of an example machine with which, in which, or by which any one or more of the techniques discussed herein can be implemented.

FIG. 6 illustrates a block diagram of an example machine 800 with which, in which, or by which any one or more of the techniques (e.g., methodologies) discussed herein can be implemented. Examples, as described herein, can include, or can operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 800 (e.g., computer system) can include a hardware processor 802 or host device (e.g., the host device, a central processing unit (CPU), a graphics processing unit (GPU), a hardware processor core, or any combination thereof), a main memory 804, a static memory 806 (e.g., memory or storage for firmware, microcode, a basic-input-output (BIOS), unified extensible firmware interface (UEFI), etc.), and mass storage device 808 or memory die stack, hard drives, tape drives, flash storage, or other block devices) some or all of which can communicate with each other via an interlink 830 (e.g., bus). The machine 800 can further include a display device 810, an alphanumeric input device 812 (e.g., a keyboard), and a user interface (UI) Navigation device 814 (e.g., a mouse). In an example, the display device 810, the input device 812, and the UI navigation device 814 can be a touch screen display. The machine 800 can additionally include a mass storage device 808 (e.g., a drive unit), a signal generation device 818 (e.g., a speaker), a network interface device 820, and one or more sensor(s) 816, such as a global positioning system (GPS) sensor, compass, accelerometer, or another sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 802, the main memory 804, the static memory 806, or the mass storage device 808 can be, or include a machine-readable media 822 on which is stored one or more sets of data structures or instructions 824 (e.g., software) embodying or used by any one or more of the techniques or functions described herein. The instructions 824 can also reside, completely or at least partially, within any of registers of the hardware processor 802, the main memory 804, the static memory 806, or the mass storage device 808 during execution thereof by the machine 800. In an example, one or any combination of the hardware processor 802, the main memory 804, the static memory 806, or the mass storage device 808 can constitute the machine-readable media 822. While the machine-readable media 822 is illustrated as a single medium, the term "machine-readable medium" can include a single medium or multiple media (e.g., a centralized or distributed database, or associated caches and servers) configured to store the one or more instructions 824.

The term "machine readable medium" can include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM), ferroelectric random access memory (FeRAM)) and flash memory devices; magnetic disks, such as internal hard disks and removable disks; magneto-optical disks; and CD-ROM and DVD-ROM disks.

In an example, information stored or otherwise provided on the machine-readable media 822 can be representative of the instructions 824, such as instructions 824 themselves or a format from which the instructions 824 can be derived. This format from which the instructions 824 can be derived can include source code, encoded instructions (e.g., in compressed or encrypted form), packaged instructions (e.g., split into multiple packages), or the like. The information representative of the instructions 824 in the machine-readable media 822 can be processed by processing circuitry into the instructions to implement any of the operations discussed herein. For example, deriving the instructions 824 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 can include assembly, compilation, or interpretation of the information (e.g., by the processing circuitry) to create the instructions 824 from some intermediate or preprocessed format provided by the machine-readable media 822. The information, when provided in multiple parts, can be combined, unpacked, and modified to create the instructions 824. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 824 can be further transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 can include one or more physical jacks (e.g., Ethernet, coaxial, or phone jacks) or one or more antennas to connect to the network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine readable medium.

To better illustrate the methods and apparatuses described herein, a non-limiting set of Example embodiments are set forth below as numerically identified Examples.

Example 1 includes A memory device comprising memory comprised of a bank area and a channel area. Example 1 can include control circuitry configured to receive a command to access the memory; and responsive to receiving the command to access the memory: provide a bank control path and a channel control path; provide a bank strobe signal over the bank control path for accessing the memory in the bank area; and provide at least two channel strobe signals over the channel control path for accessing the memory in the channel area.

In Example 2, the subject matter of Example 1 can include wherein a channel strobe signal of the at least two channel strobe signals processes a smaller amount of data than that processed by the bank strobe signal.

In Example 3, the subject matter of Example 2 can include wherein the channel strobe signal processes one half an amount of data that the bank strobe signal processes.

In Example 4, the subject matter of any one or more of Examples 1-3 can include wherein the bank control path comprises disable circuitry configured to disable a number of bank strobe signals.

In Example 5, the subject matter of Example 4 can include wherein the disable circuitry comprises delay circuitry for providing a disabling pulse delayed by an offset subsequent to the bank strobe signal.

In Example 6, the subject matter of Example 4 can include wherein the disable circuitry is configured to disable one bank strobe signal for every other channel strobe signal provided.

In Example 7, the subject matter of Example 4 can include wherein the disable circuitry is configured to refraining from disabling the bank strobe signal during mask write operations.

In Example 8, the subject matter of Example 4 can include wherein the disable circuitry is configured to refraining from disabling the bank strobe signal during internal read operations.

In Example 9, the subject matter of any one of Examples 1-8 can include wherein the memory comprises ferroelectric random access memory (FeRAM) or dynamic random access memory (DRAM).

Example 10 is a system comprising: a host device; memory comprised of a bank area and a channel area; and control circuitry configured to: receive a command to access the memory; and responsive to receiving the command to access the memory: provide a bank control path and a channel control path; provide a bank strobe signal over the bank control path for accessing memory in the bank area; and provide at least two channel strobe signals over the channel control path for accessing memory in the channel area.

In Example 11, the subject matter of Example 10 can include wherein a channel strobe signal of the at least two channel strobe signals processes one half an amount of data of the bank strobe signal.

In Example 12, the subject matter of any one or more of Examples 10-11 can include wherein the bank control path comprises disable circuitry configured to disable a number of bank strobe signals.

In Example 13, the subject matter of Example 12 can include wherein the disable circuitry is configured to disable one bank strobe signal for every other channel strobe signal provided.

In Example 14, the subject matter of Example 13 can include wherein the disable circuitry is configured to refraining from disabling the bank strobe signal during mask read operations.

In Example 15, the subject matter of any one of Examples 10-14 can include wherein the memory comprises ferroelectric random access memory (FeRAM) or dynamic random access memory (DRAM).

Example 16 is a method for accessing memory, the method comprising: receiving a command to access the memory; and responsive to receiving the command to access the memory: providing a bank strobe signal over a bank control path for accessing memory in a bank area of the memory; and providing at least two channel strobe signals over the channel control path for accessing memory in a channel area of the memory.

In Example 17, the subject matter of Example 16 can include wherein a channel strobe signal of the at least two channel strobe signals processes one half an amount of data of the bank strobe signal.

In Example 18, the subject matter of any one or more of Examples 16-17 can include disabling a number of bank strobe signals.

In Example 19, the subject matter of Example 18 includes suppressing one bank strobe signal for every other channel strobe signal provided.

In Example 20, the subject matter of any of Examples 16-19 can include refraining from disabling the bank strobe signal during mask read operations.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory device comprising:
   memory comprised of a bank area and a channel area; and
   control circuitry configured to:
      receive a command to access the memory; and
      responsive to receiving the command to access the memory:
         provide a bank control path and a channel control path;
         provide a bank strobe signal over the bank control path for accessing the memory in the bank area; and
         provide at least two channel strobe signals over the channel control path for accessing the memory in the channel area;
      wherein the bank control path comprises disable circuitry configured to selectively disable one or more bank strobe signals.

2. The memory device of claim 1, wherein a channel strobe signal of the at least two channel strobe signals processes a smaller amount of data than that processed by the bank strobe signal.

3. The memory device of claim 2, wherein the channel strobe signal processes one half an amount of data that the bank strobe signal processes.

4. The memory device of claim 1, wherein the disable circuitry comprises delay circuitry for providing a disabling pulse delayed by an offset subsequent to the bank strobe signal.

5. The memory device of claim 1, wherein the disable circuitry is configured to disable one bank strobe signal for every other channel strobe signal provided.

6. The memory device of claim 1, wherein the disable circuitry is configured to refrain from disabling the bank strobe signal during mask write operations.

7. The memory device of claim 1, wherein the disable circuitry is configured to refraining from disabling the bank strobe signal during internal read operations.

8. The memory device of claim 1, wherein the memory comprises ferroelectric random access memory (FeRAM) or dynamic random access memory (DRAM).

9. A system comprising:
a host device;
memory comprising a bank area, a bank control path, a channel area, and a channel control path, wherein the bank control path comprises disable circuitry configured to selectively disable one or more bank strobe signals; and
control circuitry configured to:
receive a command to access the memory; and
responsive to receiving the command to access the memory:
provide a bank strobe signal over the bank control path for accessing memory in the bank area; and
provide at least two channel strobe signals over the channel control path for accessing memory in the channel area.

10. The system of claim 9, wherein a channel strobe signal of the at least two channel strobe signals processes one half an amount of data of the bank strobe signal.

11. The system of claim 9, wherein the disable circuitry is configured to disable one bank strobe signal for every other channel strobe signal provided.

12. The system of claim 11, wherein the disable circuitry is configured to refraining from disabling the bank strobe signal during mask read operations.

13. The system of claim 9, wherein the memory comprises ferroelectric random access memory (FeRAM) or dynamic random access memory (DRAM).

14. A method comprising:
receiving a command to access a memory; and
responsive to receiving the command to access the memory:
providing a bank strobe signal over a bank control path for accessing memory in a bank area of the memory; and
providing at least two channel strobe signals over the channel control path for accessing memory in a channel area of the memory; and
disabling a number of bank strobe signals.

15. The method of claim 14, wherein a channel strobe signal of the at least two channel strobe signals processes one half an amount of data of the bank strobe signal.

16. The method of claim 14, further comprising suppressing one bank strobe signal for every other channel strobe signal provided.

17. The method of claim 16, further comprising refraining from disabling the bank strobe signal during mask read operations.

* * * * *